United States Patent [19]

Nakagawa et al.

[11] Patent Number: 4,700,466

[45] Date of Patent: Oct. 20, 1987

[54] METHOD OF MANUFACTURING SEMICONDUCTOR DEVICE WHEREIN SILICON SUBSTRATES ARE BONDED TOGETHER

[75] Inventors: Akio Nakagawa, Hiratsuka; Hiromichi Ohashi, Yokohama; Tsuneo Ogura, Kamakura; Masaru Shimbo, Yokohama, all of Japan

[73] Assignee: Kabushiki Kaisha Toshiba, Kawasaki, Japan

[21] Appl. No.: 825,544

[22] Filed: Feb. 3, 1986

[30] Foreign Application Priority Data

Feb. 8, 1985 [JP] Japan .................................. 60-22937

[51] Int. Cl.$^4$ ......................................... H01L 21/461
[52] U.S. Cl. .................................. 437/247; 148/33.5; 437/915
[58] Field of Search ................. 29/576 J, 582; 148/33, 148/33.5, 1.5

[56] References Cited

U.S. PATENT DOCUMENTS

| 2,701,326 | 2/1955 | Pfann et al. | 29/576 J |
| 2,743,201 | 4/1956 | Johnson et al. | 29/581 |
| 3,303,549 | 2/1967 | Peyser | 148/1.5 X |
| 4,613,381 | 9/1986 | Ogura | 148/1.5 |

FOREIGN PATENT DOCUMENTS 138024 8/1983 Japan ................................. 148/186

OTHER PUBLICATIONS

Japanese Journal of Applied Physics, vol. 17, Supplement 17-1, pp. 275-281, 1978, Azuma, et al.

1983 IEEE IEDM Technical Digest, pp. 79-82, A. M. Goodman, et al.
Originally filed claims in U.S. Ser. No. 809,193, filed Dec. 16, 1985.
Amendment Filed Feb. 25, 1987 in U.S. Ser. No. 809,193.

Primary Examiner—George T. Ozaki
Attorney, Agent, or Firm—Oblon, Fisher, Spivak, McClelland, & Maier

[57] ABSTRACT

A method of manufacturing a semiconductor device, wherein a semiconductor wafer having a first impurity-doped layer and a second impurity-doped layer having a higher impurity concentration than that of the first impurity-doped layer is formed. A first silicon substrate, having a first impurity-doped layer and a third impurity-doped layer which has a higher impurity concentration than that of the first impurity-doped layer and the same conductivity type as that of the second impurity-doped layer, and whose surface is mirror-polished, is brought into contact with a second silicon substrate which has a higher impurity concentration than that of the first impurity-doped layer and the same conductivity type as that of the second impurity-doped layer, and whose surface is mirror-polished, so that the mirror-polished surfaces thereof are in contact with each other. The contacting substrates are then placed in a clean atmosphere so that virtually no foreign substances are present therebetween, and annealed at a temperature of not less than 200° C. so as to bond them together, thereby forming the second impurity-doped layer consisting of the third impurity doped layer and the second silicon substrate.

10 Claims, 10 Drawing Figures

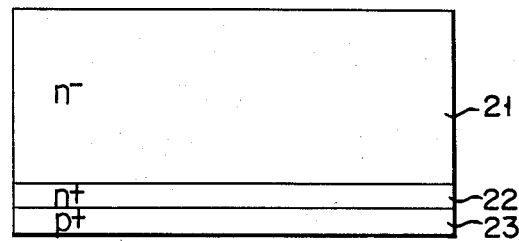
F I G. 2A
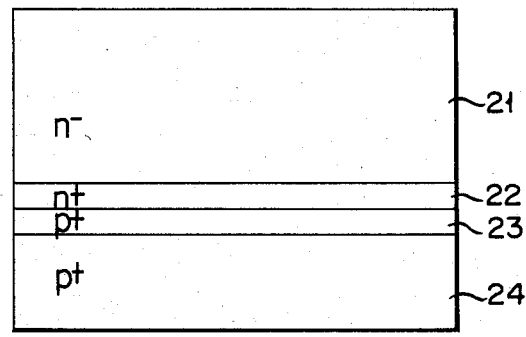
F I G. 2B
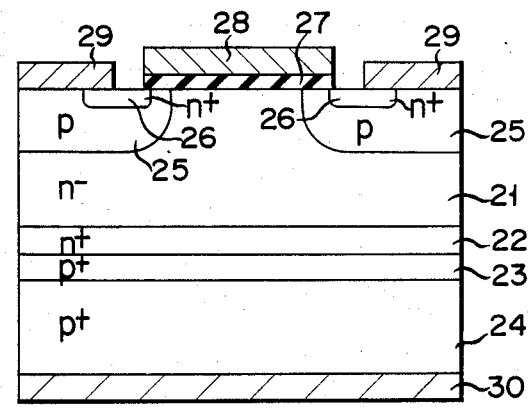
F I G. 2C

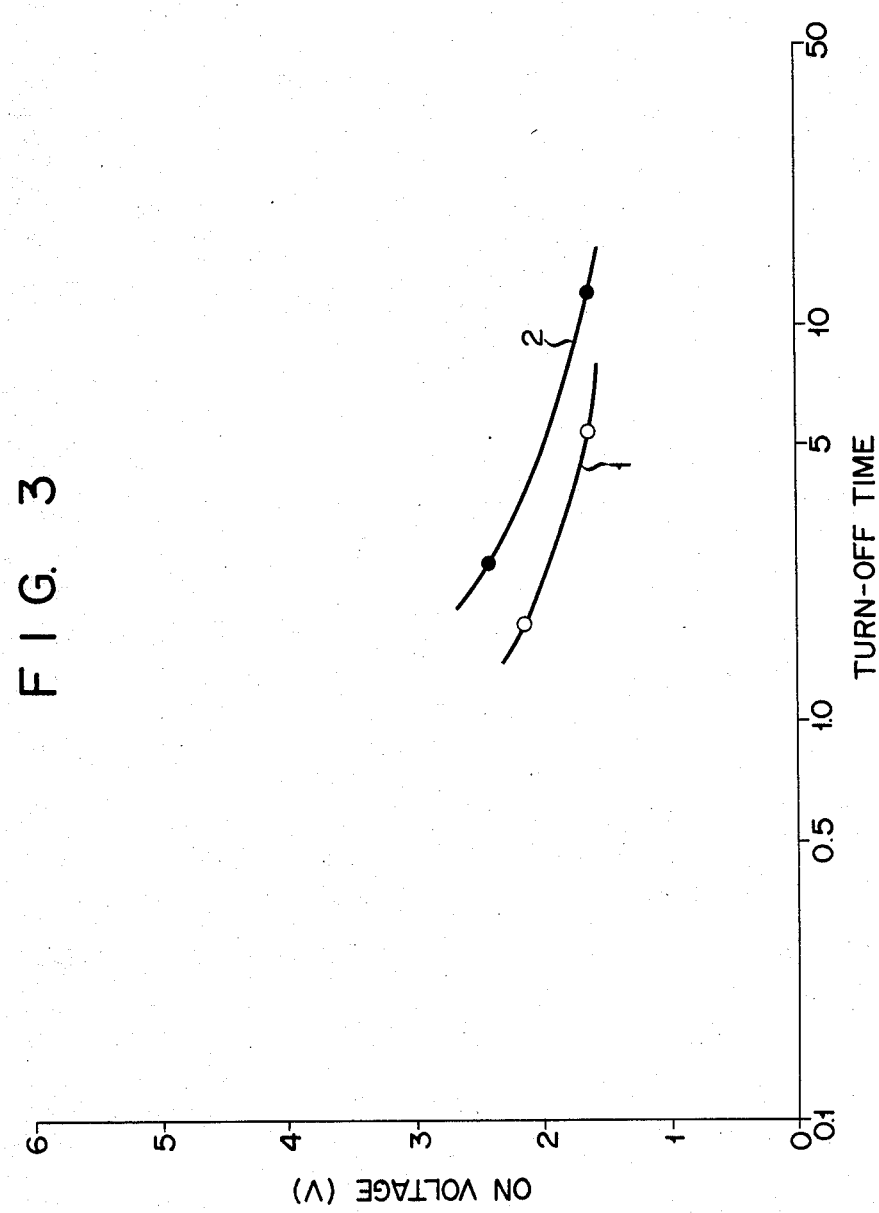

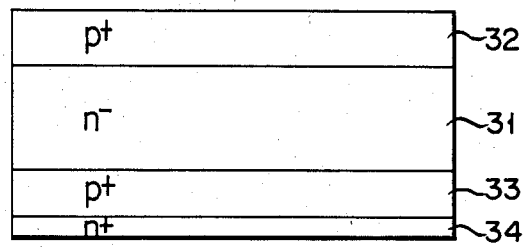
F I G. 4A
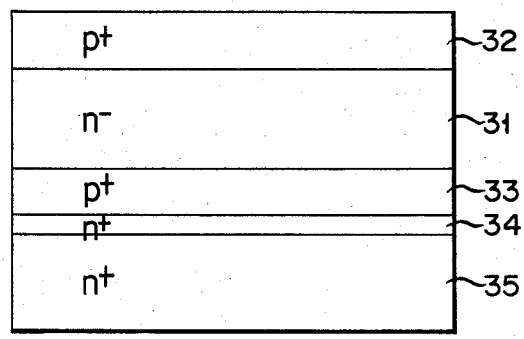
F I G. 4B
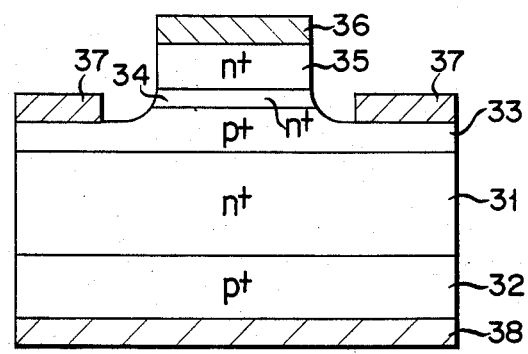
F I G. 4C

METHOD OF MANUFACTURING SEMICONDUCTOR DEVICE WHEREIN SILICON SUBSTRATES ARE BONDED TOGETHER

BACKGROUND OF THE INVENTION

I. Field of the Invention

The present invention relates to a method of manufacturing a semiconductor device, which comprises the step of forming a semiconductor wafer which can replace a semiconductor wafer having an epitaxial layer (to be referred to as an epitaxial-wafer hereinafter).

II. Description of the Prior Art

In recent power semiconductor devices, the resistivity of an eptiaxial-wafer must be increased in accordance with a rise in rated voltage. However, when a semiconductor substrate having a high impurity concentration is used, it is difficult to form a high resistance epitaxial layer thereon since an impurity from the semiconductor substrate diffuses into the layer. For example, it is very difficult to form an epitaxial-wafer having an $n^+$-$n^-$junction with an $n^-$-type epitaxial layer having a resistivity of 100 $\Omega$·cm or more.

In conductivity modulation type MOS FETs, an $n^+$-type layer and an $n^-$-type layer must be sequentially and epitaxially grown on a $p^+$-type substrate. However, when such an epitaxial-wafer is formed, since compensation of impurities occurs in an $n^+$-$p^+$junction, it is difficult to obtain desired junction characteristics. Also when an impurity-doped layer having a high impurity concentration is formed not by an epitaxial growth method but by an impurity diffusion method in another impurity-doped layer having a high impurity concentration and a conductivity type oppposite to that of the former, difficulties arise as described later.

SUMMARY OF THE INVENTION

It is an object of the present invention to provide a method of manufacturing a semiconductor device, comprising the step of forming a semiconductor wafer free from the problems of the conventional method.

According to the present invention, there is provided a method of forming a semiconductor device comprising the step of forming a semiconductor wafer having a first impurity-doped layer and a second impurity-doped layer having an impurity concentration higher than that of the first.

The step of forming the semiconductor wafer comprises the steps of:

bringing a first semiconductor substrate, having a third impurity-doped layer which has a higher impurity concentration than that of the first impurity-doped layer and the same conductivity type as that of the second impurity-doped layer, and whose surface is mirror-polished, into contact with a second semiconductor substrate having a fourth impurity-doped layer, which has a higher impurity concentration than that of the first impurity-doped layer and the same conductivity type as that of the second impurity-doped layer, and whose surface is mirror-polished, so that the mirror-polished surfaces thereof are in contact with each other, and in a clean atmosphere so that virtually no foreign substances are present therebetween; and annealing the first and second semiconductor substrates whose mirror-polished surfaces are in contact with each other at a temperature of not less than 200° C. as to bond them together, thereby forming the second impurity-doped layer consisting of the third and fourth impurity-doped layers.

In the method of the present invention, an $n^-$-type semiconductor substrate on which an $n^+$-type impurity layer having a high impurity concentration is formed at the side of its junction surface, and an $n^+$-type semiconductor substrate having a high impurity concentration are used as the first and second semiconductor substrates. A wafer having an $n^+n^-$junction is formed with this combination of substrates.

Surface roughness of the mirror-polished surface is preferably 500 Å or less. It should be noted that "surface roughness" is given by a maximum height (Rmax) defined by Japanese Industrial Standard B-0601 (1982).

In accordance with the surface conditions of the first and second semiconductor substrates, the polished surfaces are preferably washed with water, a surfactant, an organic solvent, an acid solution, or the like in order to remove contaminants (e.g., fine particles, absorbed ions, an organic material, an inorganic material, and the like), grease, and any stain film. In the case of an Si substrate, the washing step is performed using a solution mixture of $H_2O_2$ and $H_2SO_4$, boiling aqua regia, and then an HF solution.

The substrates are washed with purified water for several minutes and are then spin-dried at room temperature. This drying step aims to remove excess water and to leave water adsorbed in the mirror-polished surface of the substrate. Therefore, heat-drying at a temperature of 100° C. or higher, at which almost all adsorbed water would be vaporized, must be avoided. The mirror-polished surfaces of the substrates are in contact with each other in a clean atmosphere of, e.g., Class 1 or below, so that virtually no foreign substances lie therebetween, and are then annealed at a temperature of 200° C. or higher. In the case of an Si substrate, the annealing temperature is preferably 1,000° C. to 1,200° C.

According to the present invention, semiconductor substrates each having a high impurity concentration layer are directly bonded together without fusion to form an element wafer, thus providing the following advantages. First, an element wafer having a high resistance layer, which cannot be formed by a conventional epitaxial method, can be easily formed. For example, when $n^-$-type and $n^+$-type substrates are bonded together, since an $n^+$-type layer is formed in advance on a polished surface of the $n^-$-type substrate, even if a poor bond portion is formed on the bond interface a current escape path can be formed, thus obtaining an $n^+$-$n^-$ wafer having good junction characteristics. Since high impurity concentration layers of the same conductivity type are formed at two sides of the bond interface, any high resistance layer cannot be formed on an interface. Furthermore, when a $p^+$-$n^+$-$n^-$ wafer is formed by a conventional epitaxial method, good junction characteristics cannot be obtained due to compensation of impurities. According to the present invention, however, an $n^+$-type layer is formed on a polished surface of an $n^-$-type substrate and a $p^+$-type layer is formed thereover. The resultant structure is bonded to a $p^+$-type substrate, thereby resolving the problem of the conventional method.

BRIEF DESCRIPTION OF THE DRAWINGS

FIGS. 2A to 2C are sectional views showing steps in the manufacture of a conductivity modulation type MOS FET in Example 2 of the present invention;

FIG. 3 is a graph comparing characteristics of the MOS FET obtained in Example 2 of the present invention and a conventional epitaxial-wafer; and FIGS. 4A to 4C are sectional views showing steps in the manufacture of a gate turn-off thyristor in Example 3 of the present invention.

DETAILED DESCRIPTION OF THE PREFERRED EMBODIMENT

The present invention will now be described by way of examples with reference to the accompanying drawings.

EXAMPLES 1

Figure 1A:
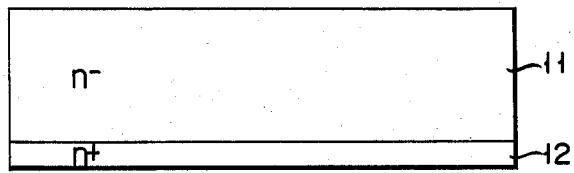
FIG. 1A to 1C are sectional views showing steps in the manufacture of a diode in Example 1 of the present invention.
Figure 1B:
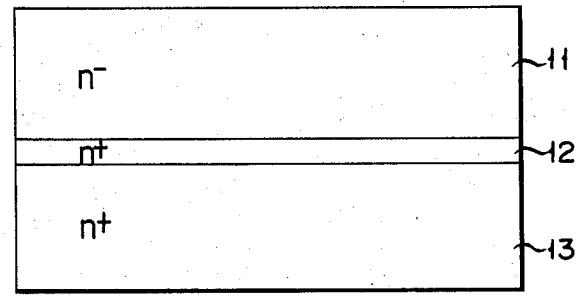
Figure 1C:
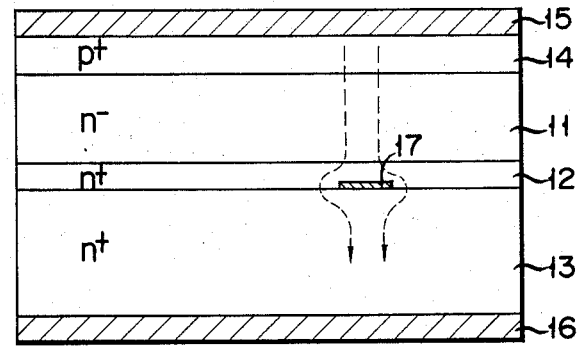

FIGS. 1A to 1C show steps in the manufacture of a $p^+n^-n^+$ diode using an $n^+$-$n^-$ wafer formed by a method of the present invention in which two substrates are directly bonded together. As shown in FIG. 1A, $n^+$-type layer 12 is formed on a mirror-polished surface (surface roughness of less than 500 Å) of high resistance $n^-$-type Si substrate (first semiconductor substrate) 11. From the polished surface, an n type impurity is ion-implanted into n type Si substrate 11. Substrate 11 is heated in an oxidizing atmosphere, whereby $n^+$ layer 12 is formed. Second semiconductor substrate, $n^+$ type substrate 13, whose surface is mirror-polished, is prepared. An oxide layer not shown has been formed on $n^+$ layer 12 during the heating process. Substrates 11 and 13 are degreased, washed with water and spin-dried. During the degreasing, water-washing or spin-drying, the oxide layer is removed, whereby the dirt formed during the ion implantation is taken from substate 11. The removal of the oxide layer can be carried out at any time. The polished surfaces of the substrates are then placed in contact with each other in a clean atmosphere of, e.g., Class 1 or below, as shown in FIG. 1B, and are annealed at a temperature of 1,000° to 1,200° C., thus preparing an $n^-$-$n^+$ wafer. The surface of the wafer at the side of substrate 11 is ground to obtain a predetermined thickness for the $n^-$-type layer, if needed. $P^+$-type layer 14 is formed on the wafer by diffusion, and electrodes 15 and 16 are then formed thereon, thus completing a $pn^- n^+$ diode.

In this example, even if poor bond portion 17 is formed in the bond interface as shown in FIG. 1C, since layer 12 covers this portion the current flows as indicated by the arrows and is not adversely influenced by portion 17. Any high resistance layer cannot be formed on a bond interface, and the resistance of the bond portion becomes sufficiently low. When the resultant diode is reverse biased, a depletion layer extending from $p^+$-type layer 14 is stopped by layer 12 and will not reach portion 17, thus preventing an increase in current leakage.

Since the $n^-$-type high resistance layer is not formed by an epitaxial method, it can be sufficiently thick and have a high resistance. In addition, when the high resistance layer is polished after the substrates are bonded, its thickness can be easily adjusted to a predetermined value.

In Example 1, the first conductivity type corresponds to n-type. However, the present invention is also effective when p-type is selected as the first conductivity type, and a diode is formed using a $p^-$-$p^+$ wafer.

EXAMPLE 2

FIGS. 2A to 2C show steps in the manufacture of a conductivity modulation type MOSFET using a $p^+$-$n^+$-$n^-$ wafer formed by the method of the present invention in which two substrates are directly bonded together. As shown in FIG. 2A, $n^+$-type layer 22 is formed by diffusion on a mirror-polished surface of $n^-$-type Si substrate (first semiconductor substrate) 21 in the same manner as in Example 1, and $p^+$-type layer 23 is formed thereon by diffusion. $P^+$-type Si substrate (second semiconductor substrate) 24, whose surface is mirror-polished, is also prepared. $N^+$-type layer 22 has a surface concentration of $1 \times 10^{19}/cm^3$ and a thickness of 15 μm, and $p^+$-type layer 23 has a surface concentration of $5 \times 10^{20}/cm^3$ and a thickness of 2 μm. The two substrates are subjected to the same pretreatment as in Example 1 and the mirror-polished surfaces thereof are placed in contact with each other in a clean atmosphere and bonded together by annealing, as shown in FIG. 2B.

A conductivity modulation type MOS FET is manufactured using the thus obtained $p^+$-$n^+$-$n^-$ wafer, as shown in FIG. 2C. After the surface of the wafer at the side of substrate 21 is polished to obtain a predetermined thickness, p-type base layer 25 and $n^+$-type emitter layer 26 are formed by a double diffusion method. Gate electrode 28 is formed through gate insulation film 27. Source electrode 29 and drain electrode 30 are then formed, thus completing a conductivity modulation type MOS FET.

With this example, unlike the case where $n^+$-type and $n^-$-type layers are epitaxially grown on a $p^+$-type substrate, compensation of impurities in an epitaxial growth step does not occur and a good junction can be formed between high concentration layers. Since $n^-$-type substrate 21 with $n^+$-type layer 22 is bonded to $p^+$-type substrate 24 through $p^+$-type layer 23 formed on layer 22, the resistance at the junction surface can be reduced sufficiently as in Example 1. Furthermore, since the resistance and thickness of the $n^-$-type layer can be desirely set, an element having a breakdown voltage of 1,800 V or higher can be realized.

ON voltages and turn-off times of the conductivity modulation type MOS FET (rated voltage: 1,200 V) obtained in Example 2 and a conventional MOS FET (rated voltage: 1,200 V) formed from an epitaxial-wafer were compared ($J_D$: 100 A/cm², $T_J$: 25° C.). FIG. 3 shows the results. In FIG. 3, curve 1 indicates characteristics of the MOS FET obtained in Example 2 and curve 2 indicates characteristics of the conventional MOS FET. As can been seen from a comparison of curves 1 and 2, the MOS FET obtained in Example 2 exhibits a better ON voltage and turn-off time. This is because the $p^+$-type substrate can be used in the method of the present invention, but cannot be used in the conventional method using an epitaxial growth method. In addition, an $n^+$-type buffer layer having a desired impurity concentration can be formed with the method of the present invention, but cannot be formed with the conventional method.

In Example 2, the first conductivity type is p-type and the second conductivity type is n-type. As in Example 1, however, the present invention can be applied equally effectively to the manufacture of a conductivity modulation type MOS FET when the above relationship is reversed, and an $n^+$-$p^+$-$p^-$ wafer is formed.

EXAMPLE 3

FIGS. 4A to 4C show steps in the manufacture of a gate turn-off (GTO) thyristor using an $n^+$-$p^+$-$n^-$ wafer formed by the method of the present invention. As shown in FIG. 4A, p+-type layers 32 and 33 having an impurity concentration of $1\times10^{18}/cm^3$ are formed by diffusion on two surfaces of high resistance n⁻-type Si substrate (first semiconductor substrate) 31, whose surface is mirror-polished as in Example 1. Furthermore, n+-type layer 34, having an impurity concentration of $1\times10^{21}/cm^3$ and a depth of several micrometers, is formed on the layer 33. N+-type Si substrate (second semiconductor substrate) 35, whose surface is similarly mirror-polished, is also prepared. The two substrates are bonded together as shown in FIG. 4B under the same conditions as in the above example, thus preparing an n+-p+-n⁻-p+ wafer. As shown in FIG. 4C, the surface of the wafer on the side of substrate 35, which serves as an emitter, is mesa etched to expose p+-type layer 33. Cathode electrode 36, gate electrode 37, and anode electrode 38 are then formed, thus completing a GTO thyristor.

As is well known, in the GTO thyristor the turn-off current can be decreased in proportion to a decrease in the lateral resistance of the p-type base layer. When the n+-type emitter layer in the structure shown in FIG. 4C is formed by diffusion as in the conventional method, a p-type impurity near the surface of the p+-type base layer is cancelled by n+-type impurity diffusion. Therefore, in order to obtain a predetermined lateral resistance of the p-type base layer, the p-type base layer must be diffused for a long period of time, and it is difficult to control its impurity concentration. With this example, however, n+-type layer 34 formed in FIG. 4A can be very thin, and its impurity concentration can be controlled precisely. When n+-type substrate 35 as the n-type emitter layer is bonded, an impurity in p+-type layer 33 will not be compensated due to the presence of n+-type layer 34. Therefore, the concentration of the p-type base layer can be controlled with high precision, and a GTO thyristor having stable turn-off characteristics can be obtained.

In this example, the relationship between the conductivity types of respective portions can be reversed, and a p+-n+-p⁻-n+ wafer can be formed. The present invention is equally effective with this arrangement.

The present invention is not limited to the above examples. Various changes and modifications may be made within the spirit and scope of the invention. For example, the present invention can be applied to the case where a compound semiconductor (e.g., GaAs) is used as the semiconductor material.

What is claimed is:

1. A method of manufacturing a semiconductor device, wherein a silicon wafer having a first impurity-doped layer and a second impurity doped layer with a higher impurity concentration than said first impurity-doped layer is formed, comprising the steps of:

providing a first silicon substrate having a first impurity-doped layer and a third impurity-doped layer which has a higher impurity concentration than that of said first impurity-doped layer, said third impurity-doped layer having a mirror-polished surface;

providing a second silicon substrate having a higher impurity concentration than that of said first impurity-doped layer and the same conductivity type as said third impurity-doped layer, said second silicon substrate having a mirror-polished surface;

bringing the mirror polished surfaces of said third impurity-doped layer and said second silicon substrate into contact in a clean atmosphere so that virtually no foreign substances are present therebetween; and annealing said first and second silicon substrates with the mirror-polished surfaces in contact with each other at a temperature of at least 200° C. so as to bond said substrates together without fusion, thereby forming a silicon wafer with said third impurity-doped layer and said second substrate bonded together and forming a second impurity-doped layer.

2. A method according to claim 1, wherein said first and second impurity-doped layers are of the same conductivity type, and said first semiconductor substrate consists of said first and third impurity-doped layers.

3. A method according to claim 1, wherein said first and second impurity-doped layers are of different conductivity types; and said first semiconductor substrate consists of said first impurity-doped layer, a fourth impurity-doped layer formed thereon which has a higher impurity concentration than that of said first impurity-doped layer and is of the same conductivity type as that of said first impurity-doped layer, and said third impurity-doped layer formed thereon.

4. A method according to claim 1, wherein said semiconductor device is a diode, and said second impurity-doped layer serves as a cathode.

5. A method according to claim 1, wherein said semiconductor device is a conductivity modulation type metal oxide semiconductor device, and said second impurity-doped layer serves as an emitter.

6. A method according to claim 1, wherein a roughness of the mirror-polished surface is not more than 500Å.

7. A method according to claim 1, wherein an annealing temperature falls within the range of 1,000° to 1,200° C.

8. A method according to claim 1, wherein an oxide film is formed on said third impurity-doped layer, comprising removing the oxide film from said third impurity-doped layer before bonding.

9. A method according to claim 1, wherein said first and second impurity-doped layers are of the same conductivity type, and said first semiconductor substrate consists of said first and third impurity-doped layers.

10. A method according to claim 1, wherein said first and second impurity-doped layers are of different conductivity types; and said first semiconductor substrate consists of said first impurity-doped layer, a fourth impurity-doped layer formed thereon which has a higher impurity concentration than that of said first impurity-doped layer and is of the same conductivity type as that of said first impurity-doped layer, and said third impurity-doped layer formed thereon.

* * * * *